(12) United States Patent
Jeong et al.

(10) Patent No.: US 12,456,651 B2
(45) Date of Patent: Oct. 28, 2025

(54) SEMICONDUCTOR DIE FORMING AND PACKAGING METHOD USING ULTRASHORT PULSE LASER MICROMACHINING

(71) Applicant: MagnaChip Semiconductor, Ltd., Cheongju-si (KR)

(72) Inventors: Jin Won Jeong, Seoul (KR); Jae Sik Choi, Cheongju-si (KR); Byeung Soo Song, Sejong-si (KR)

(73) Assignee: MagnaChip Semiconductor, Ltd., Cheongju-si (KR)

( * ) Notice: Subject to any disclaimer, the term of this patent is extended or adjusted under 35 U.S.C. 154(b) by 418 days.

(21) Appl. No.: 17/231,074

(22) Filed: Apr. 15, 2021

(65) Prior Publication Data

US 2021/0407854 A1 Dec. 30, 2021

(30) Foreign Application Priority Data

Jun. 26, 2020 (KR) .................. 10-2020-0078137

(51) Int. Cl.
*H01L 21/78* (2006.01)
*H01L 21/268* (2006.01)
*H01L 21/304* (2006.01)
*H01L 21/67* (2006.01)

(52) U.S. Cl.
CPC ............ *H01L 21/78* (2013.01); *H01L 21/268* (2013.01); *H01L 21/3043* (2013.01); *H01L 21/67092* (2013.01)

(58) Field of Classification Search
CPC .......... B23K 26/00–70; B23K 2103/56; B23K 26/0624; B23K 26/364; B23K 26/402; H01L 21/78–786; H01L 21/3043; H01L 21/268; H01L 21/67092; H01L 21/31105; H01L 2224/16225; H01L 2224/29298; H01L 2224/73204; H01L 2224/83192; H01L 23/49503; H01L 23/49572; H01L 23/49816

See application file for complete search history.

(56) References Cited

U.S. PATENT DOCUMENTS

| | | | |
|---|---|---|---|
| 7,638,729 B2 | 12/2009 | Park | |
| 9,041,198 B2 | 5/2015 | Lei et al. | |
| 10,854,517 B2 | 12/2020 | Bae et al. | |
| 2006/0096426 A1 | 5/2006 | Park | |
| 2013/0309844 A1 | 11/2013 | Takeda | |
| 2015/0111363 A1 | 4/2015 | Lei et al. | |

(Continued)

FOREIGN PATENT DOCUMENTS

| | | |
|---|---|---|
| JP | 2004-258487 A | 9/2004 |
| JP | 2006-130556 A | 5/2006 |

(Continued)

*Primary Examiner* — Julio J Maldonado
*Assistant Examiner* — Stanetta D Isaac
(74) *Attorney, Agent, or Firm* — NSIP Law

(57) ABSTRACT

A semiconductor die forming method includes preparing a wafer, forming a low-k dielectric layer on the wafer, forming a metal pad on the low-k dielectric layer, forming a passivation layer on the metal pad, patterning the passivation layer, laser grooving the low-k dielectric layer using an ultrashort pulse laser, and cutting the wafer by mechanical sawing to form one or more semiconductor dies.

16 Claims, 20 Drawing Sheets

(56) References Cited

U.S. PATENT DOCUMENTS

| | | | |
|---|---|---|---|
| 2015/0255346 A1* | 9/2015 | Park | B23K 26/20 |
| | | | 219/121.68 |
| 2019/0304838 A1* | 10/2019 | Saeki | H01L 21/30655 |
| 2020/0058551 A1 | 2/2020 | Bae et al. | |
| 2021/0043515 A1* | 2/2021 | Park | H01L 21/30655 |

FOREIGN PATENT DOCUMENTS

| | | |
|---|---|---|
| JP | 2016-539497 A | 12/2016 |
| KR | 10-2020-0014195 A | 2/2020 |
| KR | 10-2020-0021273 A | 2/2020 |

* cited by examiner

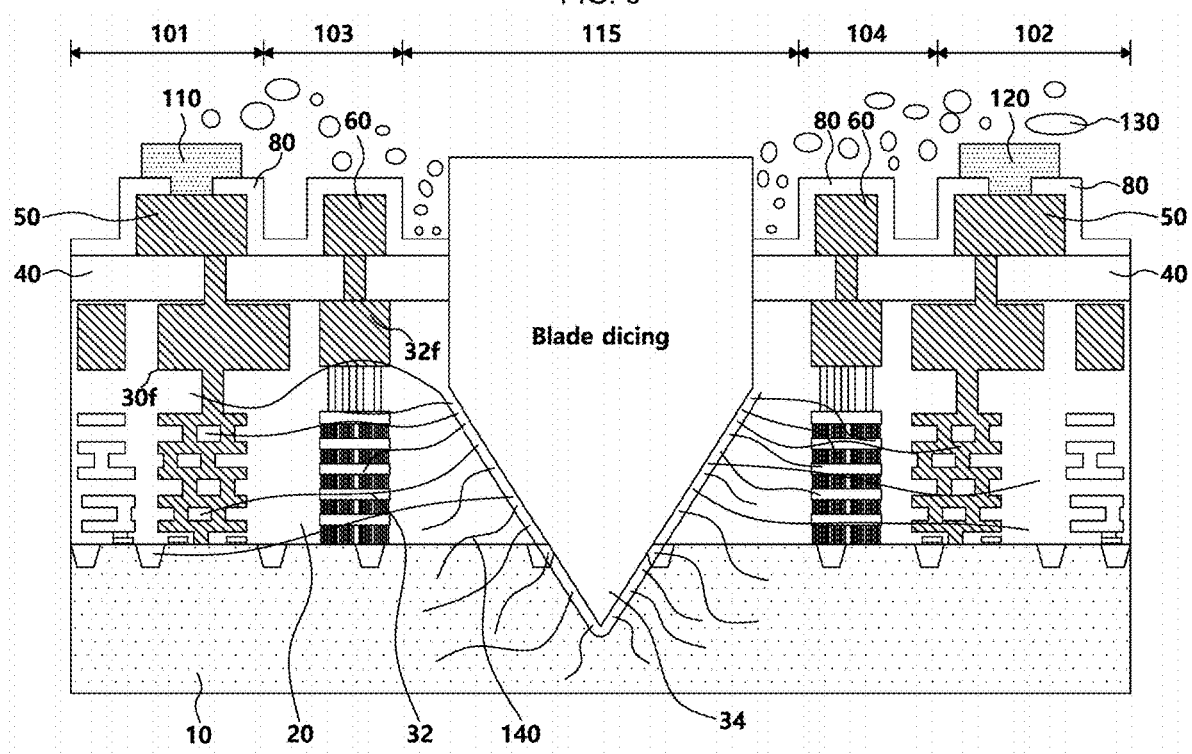

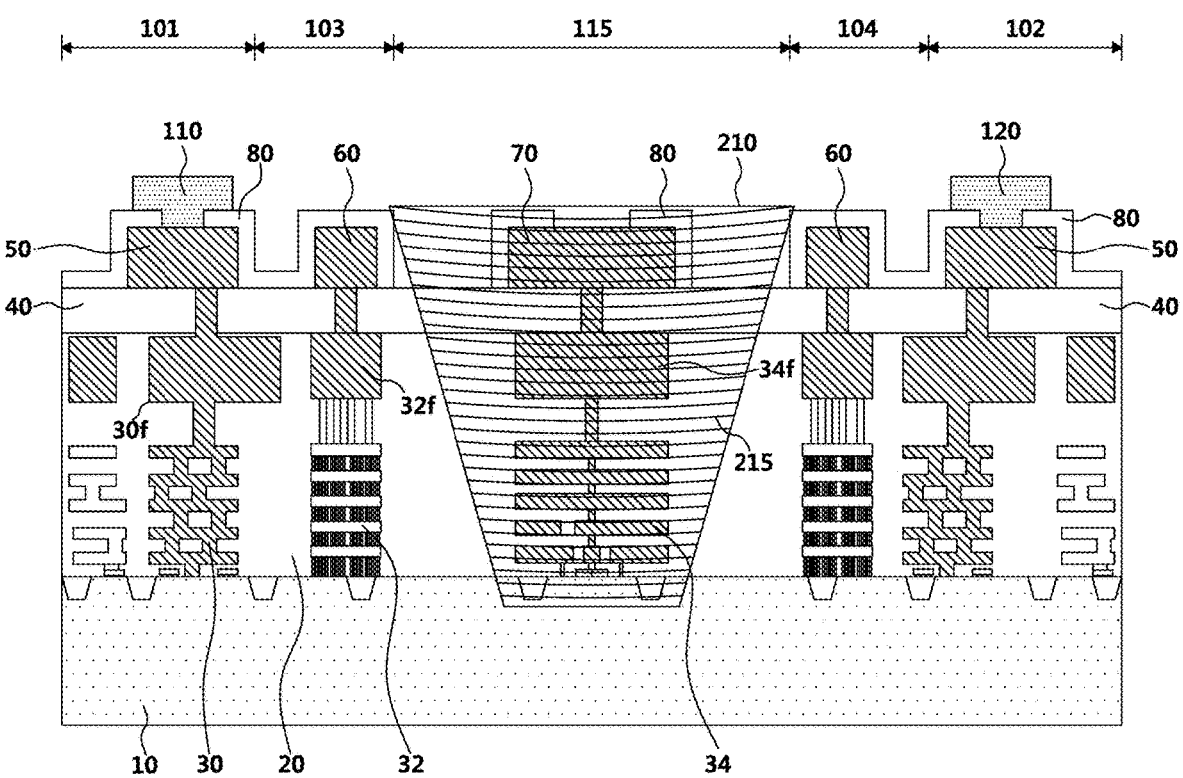

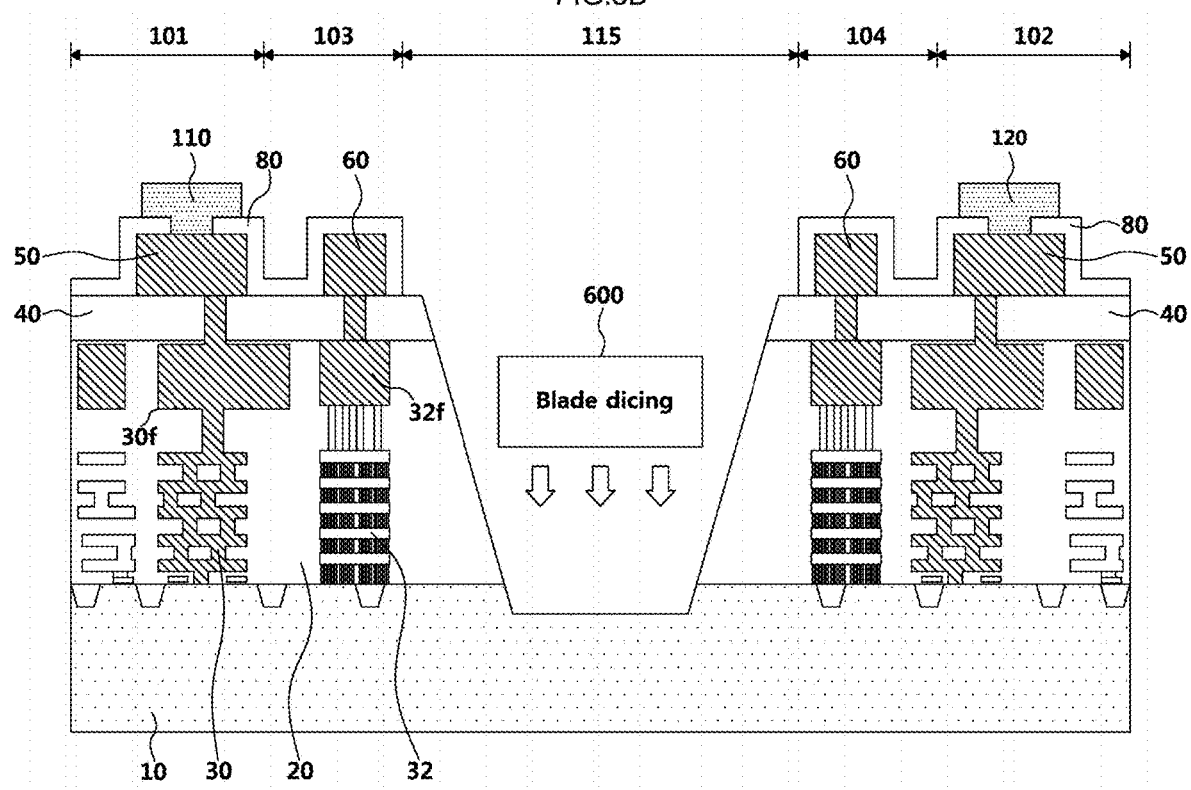

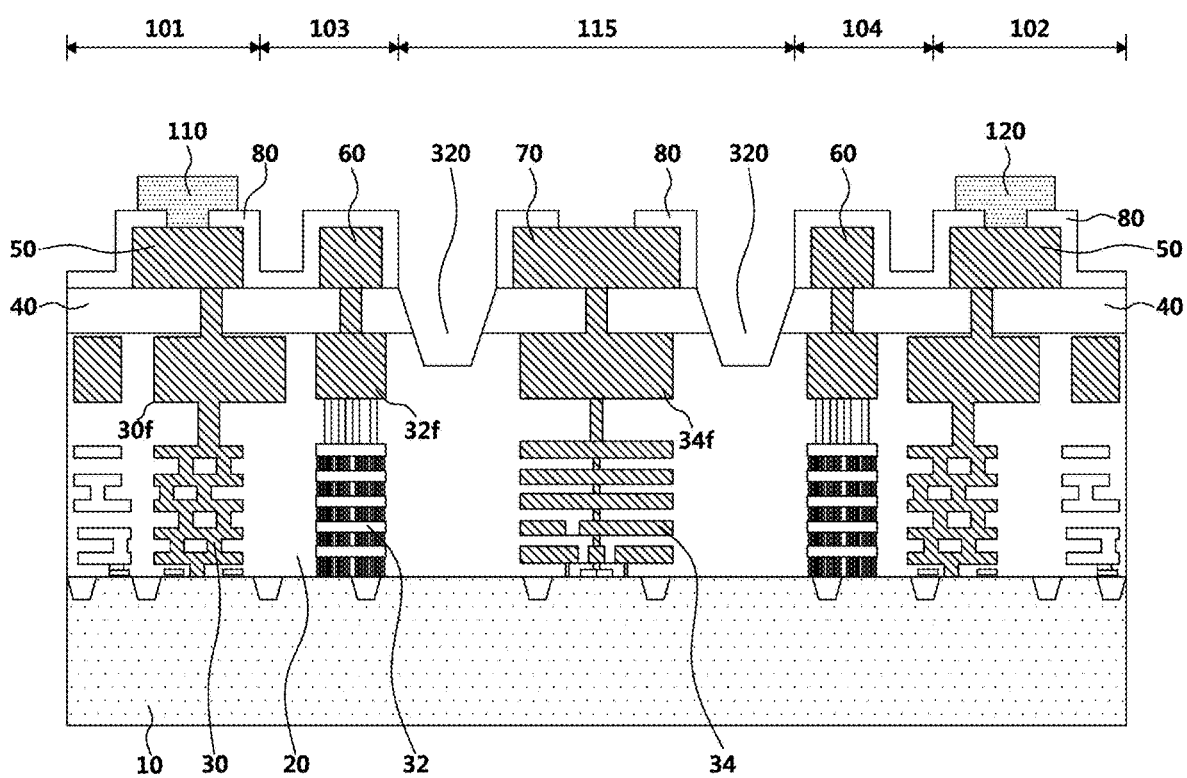

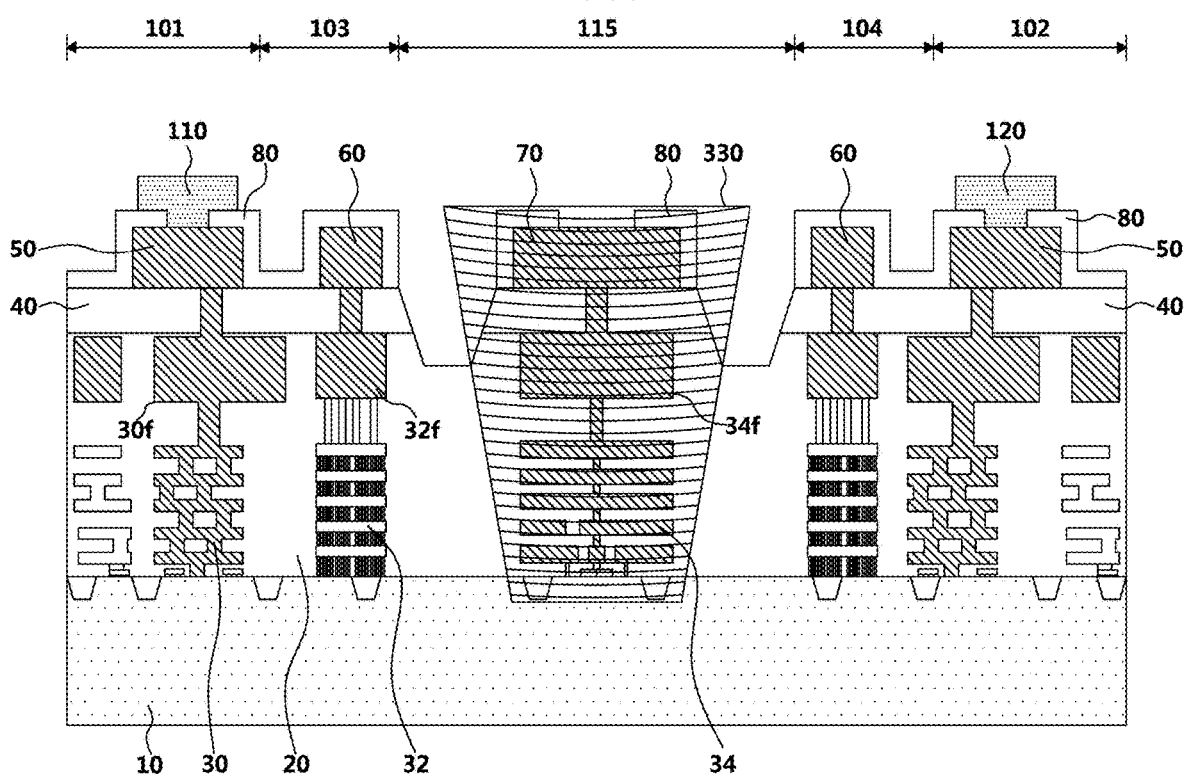

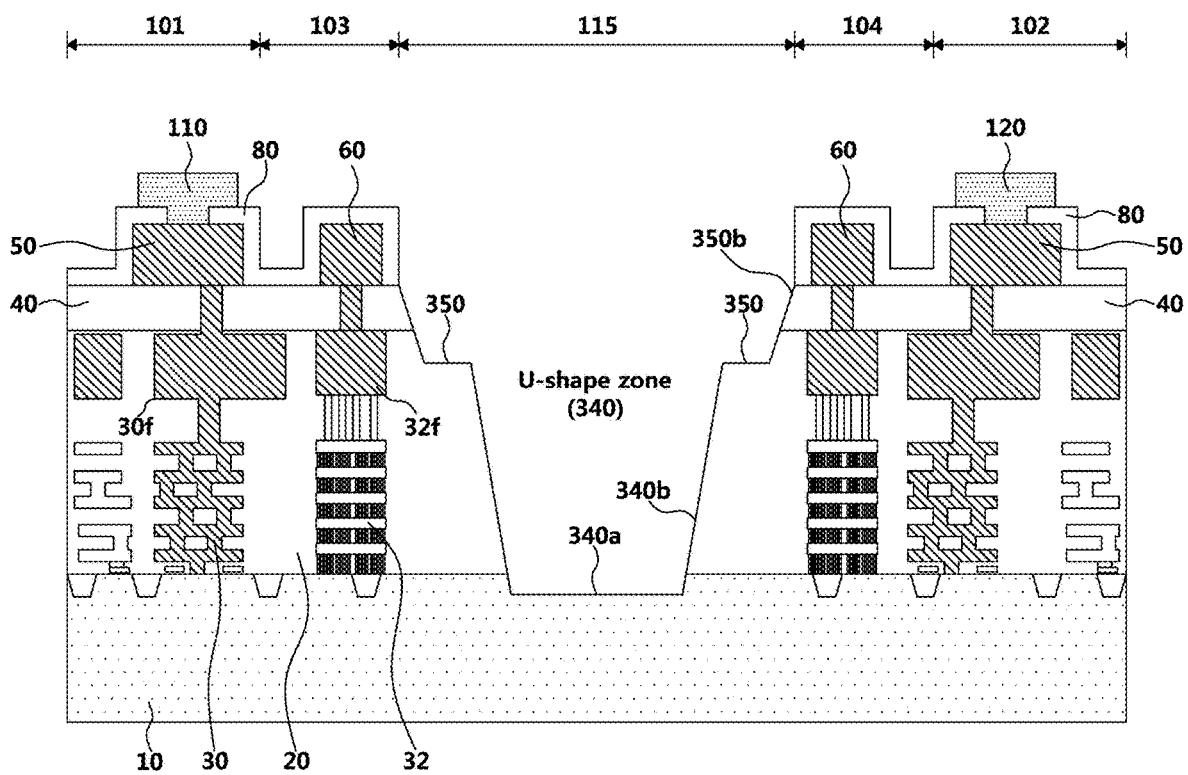

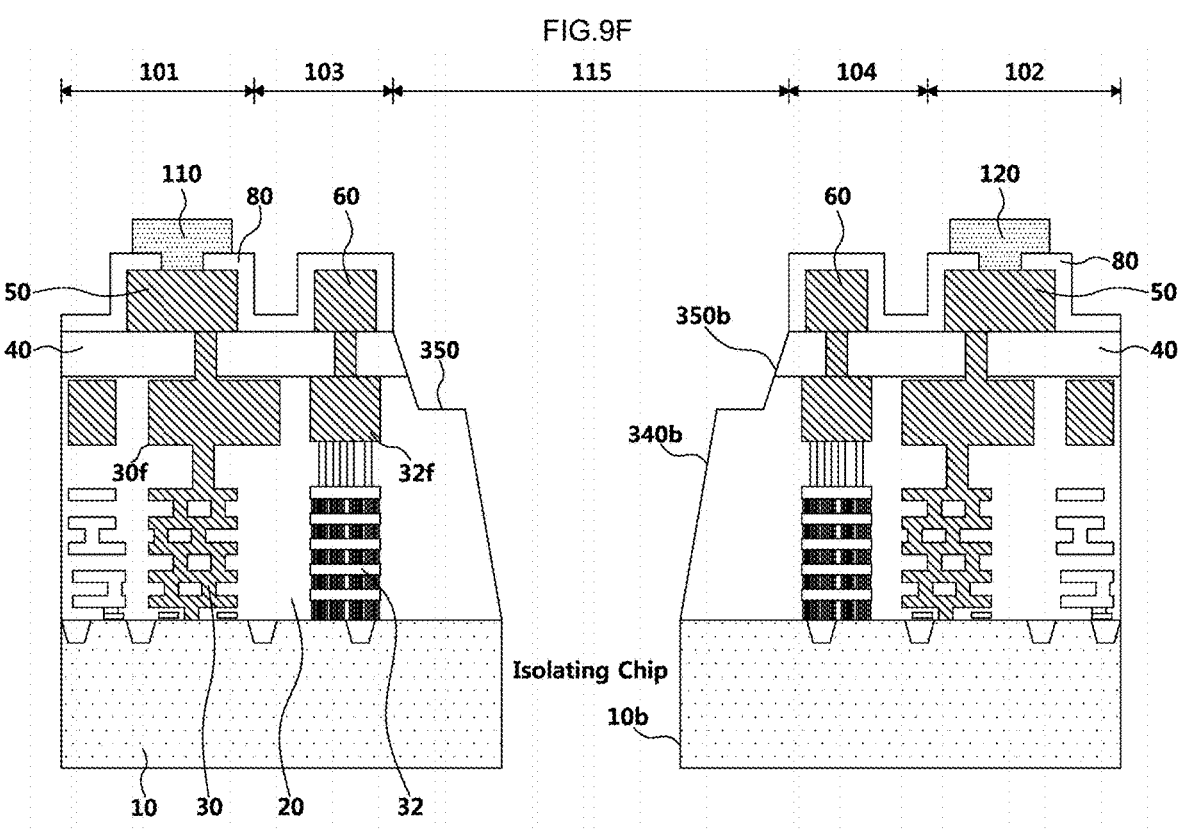

SEMICONDUCTOR DIE FORMING AND PACKAGING METHOD USING ULTRASHORT PULSE LASER MICROMACHINING

CROSS-REFERENCE TO RELATED APPLICATIONS

This application claims the benefit under 35 U.S.C. 119(a) of Korean Patent Application No. 10-2020-0078137 filed on Jun. 26, 2020, with the Korean Intellectual Property Office, the entire disclosure of which is incorporated herein by reference for all purposes.

BACKGROUND

1. Field

The present disclosure relates to a semiconductor die forming and packaging method using ultrashort pulse laser micromachining.

2. Description of Related Art

In order to form an individual semiconductor die, a mechanical sawing or mechanical dicing method is generally used. A typical example is sawing or dicing using a diamond blade.

FIG. 6 illustrates a typical method of sawing or dicing using a diamond blade. However, as the chip size becomes smaller and a low-k dielectric layer is used for a semiconductor device, various problems may arise with the diamond blade sawing process. Cracks 140 may be generated in the sawing process, which may affect the semiconductor device region resulting in defects in the device. During the blade sawing process, metal and insulating regions in a test pattern of a scribe line 115 are sawed, and residues 130 generated during sawing may be generated even in the device region, which may cause a short in the insulation, for example, during future operations of the device.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a semiconductor die forming method includes preparing a wafer, forming a low-k dielectric layer on the wafer, forming a metal pad on the low-k dielectric layer, forming a passivation layer on the metal pad, patterning the passivation layer, laser grooving the low-k dielectric layer using an ultrashort pulse laser, and cutting the wafer by mechanical sawing to form one or more semiconductor dies.

A pulse width of the ultrashort pulse laser may be in picoseconds or femtoseconds, and the ultrashort pulse laser may operate at ultraviolet or infrared wavelengths.

The laser grooving of the low-k dielectric layer may include performing a first low-power laser grooving to form a first groove region, and performing a second low-power laser grooving to form a second groove region.

A slope of a side surface of the first groove region and a slope of a side surface of the second groove region may be different from each other.

A thickness of the second groove region may be greater than a thickness of the first groove region.

A U-shape zone may be formed by the laser grooving of the low-k dielectric layer.

The method of may further include attaching the one or more semiconductor dies to a display flexible substrate using an anisotropic conductive film including a conductive ball.

The laser grooving of the low-k dielectric layer may be performed until the one or more semiconductor dies are exposed.

The method may further include forming a bump connected to the metal pad.

The method may further include forming a metal wire on the low-k dielectric layer, and depositing an interlayer dielectric layer on the metal wire. The interlayer dielectric layer may be exposed by the patterning of the passivation layer, and a light source of the ultrashort pulse laser may directly irradiate the interlayer dielectric layer to remove the interlayer dielectric layer.

In another general aspect, a semiconductor die includes a semiconductor die region formed on a substrate, a low-k dielectric layer and metal wire formed in the semiconductor die region, a metal pad connected to the metal wire, a bump connected to the metal pad. A slope of a side surface of the low-k dielectric layer and a slope of a side surface of the semiconductor die are different from each other.

The semiconductor die may be attached to a display flexible substrate.

The semiconductor die may further include an anisotropic conductive film, including a conductive ball, between the semiconductor die and the display flexible substrate.

The slope of the side surface of the low-k dielectric layer may have two different slopes.

The side surface of the low-k dielectric layer may be formed by an ultrashort laser processing method.

The side surface of the semiconductor die may be formed by a diamond blade method.

The slope of the side of the low-dielectric layer may be smaller than the slope of the side of the semiconductor die.

In another general aspect, a chip packaging method includes forming a low-k dielectric layer on a wafer, forming a metal pad on the low-k dielectric layer, forming a passivation layer on the metal pad, patterning the passivation layer, laser grooving the low-k dielectric layer using an ultrashort pulse laser, cutting the wafer by mechanical sawing to form one or more semiconductor dies and disposing one of the one or more semiconductor dies on a display flexible substrate.

The method may further include an anisotropic conductive film, including a conductive ball, disposed between the semiconductor die and the display flexible substrate.

A slope of a side surface of the low-k dielectric layer may have two different slopes.

A slope of a side surface of the low-k dielectric layer and a slope of a side surface of the semiconductor die may be different from each other.

The laser grooving of the low-k dielectric layer may include performing a first low-power laser grooving to form a first groove region, and performing a second low-power laser grooving to form a second groove region.

A U-shape zone may be formed by the laser grooving of the low-k dielectric layer.

The chip packaging method may be used to package a Chip-on-Plastic or Chip-on-Panel.

Other features and aspects will be apparent from the following detailed description, the drawings, and the claims.

BRIEF DESCRIPTION OF DRAWINGS

FIG. 6 is a process of isolating a device through a blade dicing process according to the alternative art.

FIGS. 8A to 8E are diagrams for an example of a micromachining using an ultrashort pulse laser having picoseconds or femtoseconds pulse width.

FIGS. 9A to 9F are cross-sectional views of an example of a semiconductor die after a micromachining using an ultrashort pulse laser having picoseconds or femtoseconds pulse width.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
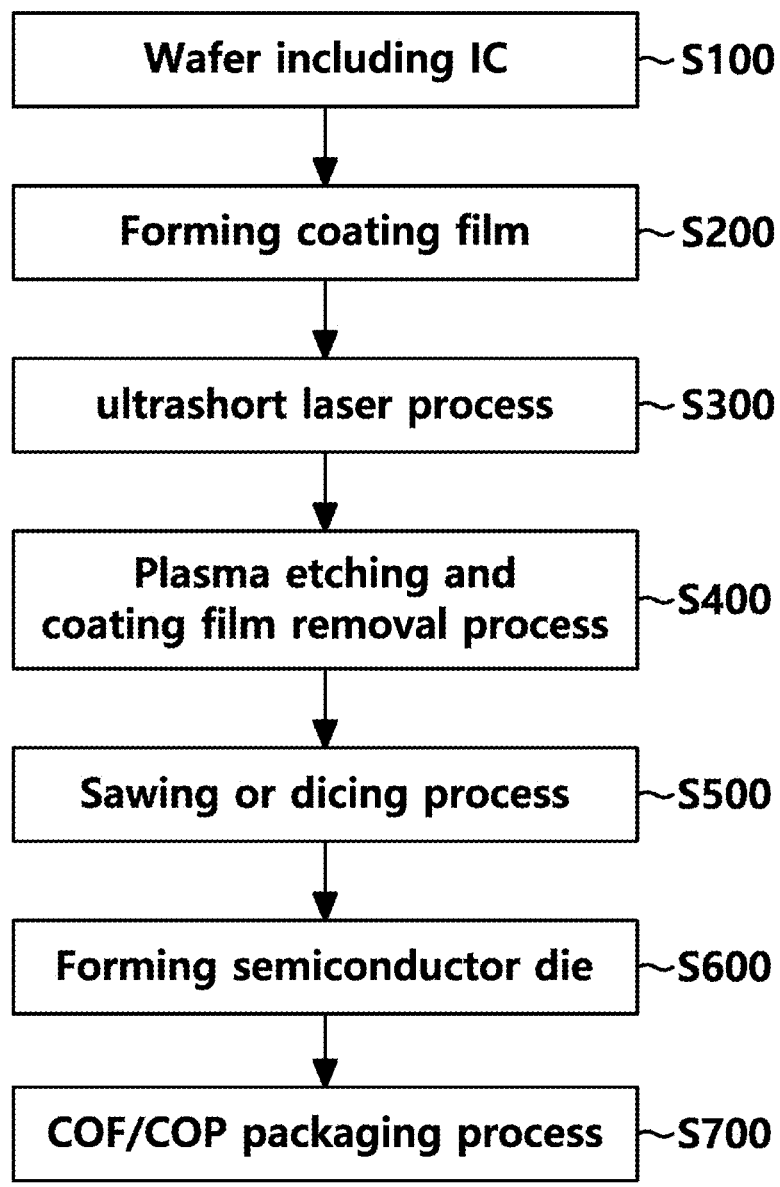
FIG. 1 is a flowchart of an example of a semiconductor die forming method and packaging process.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

The features of the examples described herein may be combined in various ways as will be apparent after an understanding of the disclosure of this application. Further, although the examples described herein have a variety of configurations, other configurations are possible as will be apparent after an understanding of the disclosure of this application.

The present disclosure provides a method of cutting a wafer using an ultrashort pulse laser micromachining having picoseconds or femtoseconds pulse width and forming a semiconductor die.

In addition, using an ultrashort pulse laser micromachining method having picoseconds or femtoseconds pulse width as disclosed may minimize problems, such as conductive particle or laser residue generated during laser processing, weakening of intensity of the wafer, laser debris, recasting, chipping, passivation feeling, die crack, and top side chipping.

Hereinafter, the present disclosure will be described in more detail based on the example illustrated in the drawings.

FIG. 1 is a flowchart of an example of a semiconductor die forming and a packaging method.

As illustrated, in operation S100, the semiconductor die is formed by preparing a wafer 100 on which an IC or a semiconductor device is formed. In operation S200, a coating film is formed on the entire surface of the wafer 100. In operation S300, an ultrashort pulse laser is processed. In operation S400, plasma etching and removing coating film is performed on the laser-processed wafer. In operation S500, a sawing process of cutting a semiconductor substrate to form an individual semiconductor die is performed. In operation S600, a semiconductor die is formed. In operation S700, a COF or COP packaging of a semiconductor die is performed. Here, the sawing process S500 of cutting a semiconductor substrate to form an individual semiconductor die may refer to a mechanical sawing process using a diamond blade.

The plasma etching process S400 may be an optional process. Removing the coating film and a mechanical sawing process using a diamond blade S500 may be performed after the ultrashort pulse laser processing S300 without the plasma etching process S400.

The present disclosure may completely remove conductive particle or laser residue generated by such laser processing, laser grooving process. This process is described in more detail with reference to the drawings.

Figure 2:
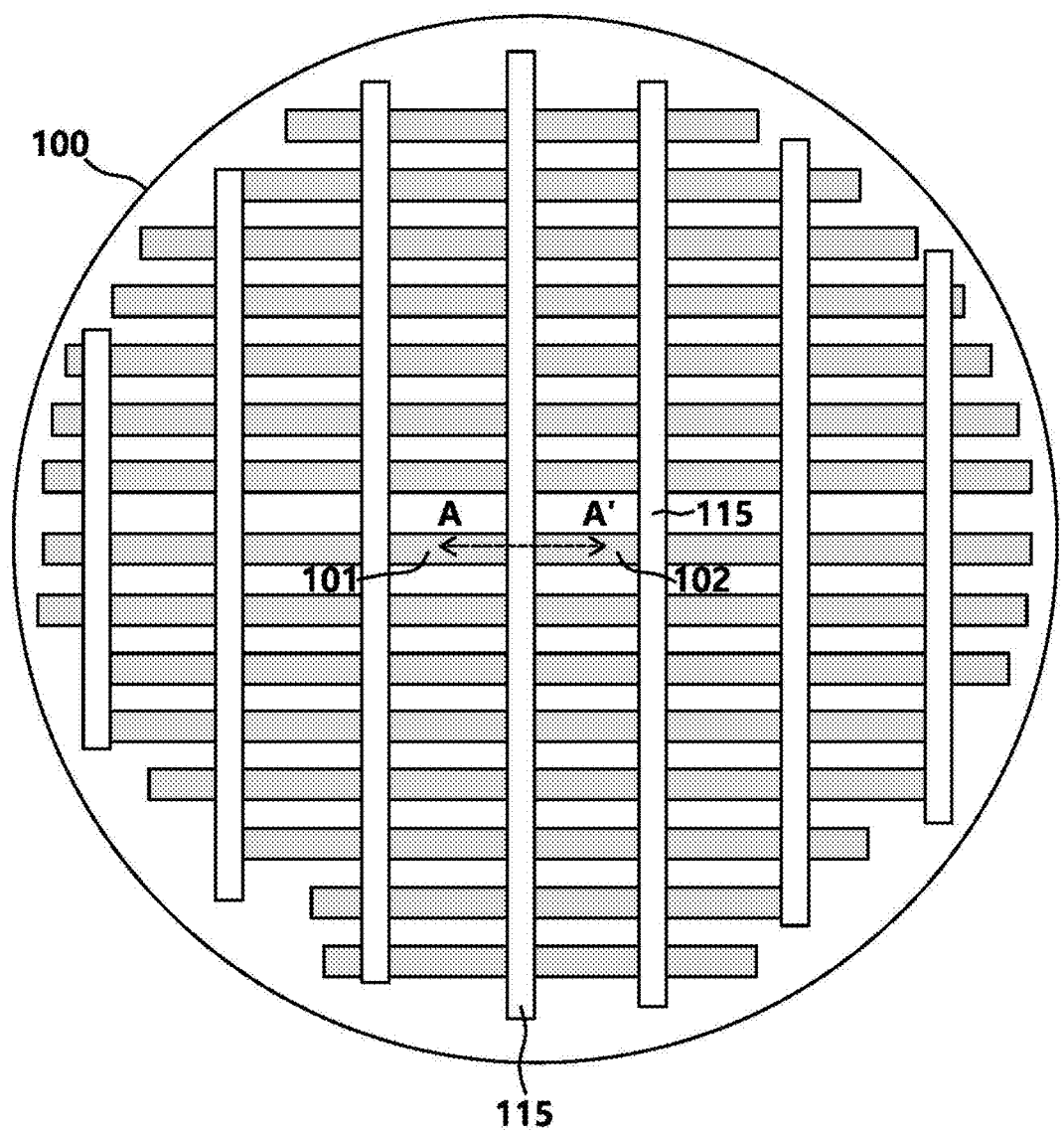
FIG. 2 illustrates an example of a wafer in which a plurality of semiconductor dies is embedded.

FIG. 2 illustrates an example of a wafer in which a plurality of semiconductor dies is embedded.

A plurality of semiconductor device regions 101 and 102 are formed in the wafer 100. Here, the wafer 100 may be a variety of semiconductor substrates, and may typically be formed of a Si substrate, an SOI substrate, a SiGe substrate, or a SiC substrate. In addition, various circuits are formed in the semiconductor device regions 101 and 102. For example, in the case of manufacturing a display driving chip, various devices and circuits desired for driving the display may be formed in the semiconductor device region. In addition, a scribe line 115 or a street 115 may be formed between the plurality of semiconductor device regions 101 and 102. A pattern for testing electrical characteristics of semiconductor devices formed in the semiconductor device regions 101 and 102 may be formed in the scribe line 115. In addition, a TEG for measuring the thickness or critical dimension CD of the film may be formed in a manufacturing process operation. Alternatively, an align mark for aligning a photomask may be formed. When the manufacturing process or test is completed, a scribe line 115 or a street 115 is to be cut to form a display driver semiconductor die or chip. As part of the cutting process, a laser cutting process or a grooving process, or a diamond blade sawing process may be performed. In the present disclosure, laser grooving and diamond blade sawing are sequentially performed as part of the cutting process.

Figure 3:
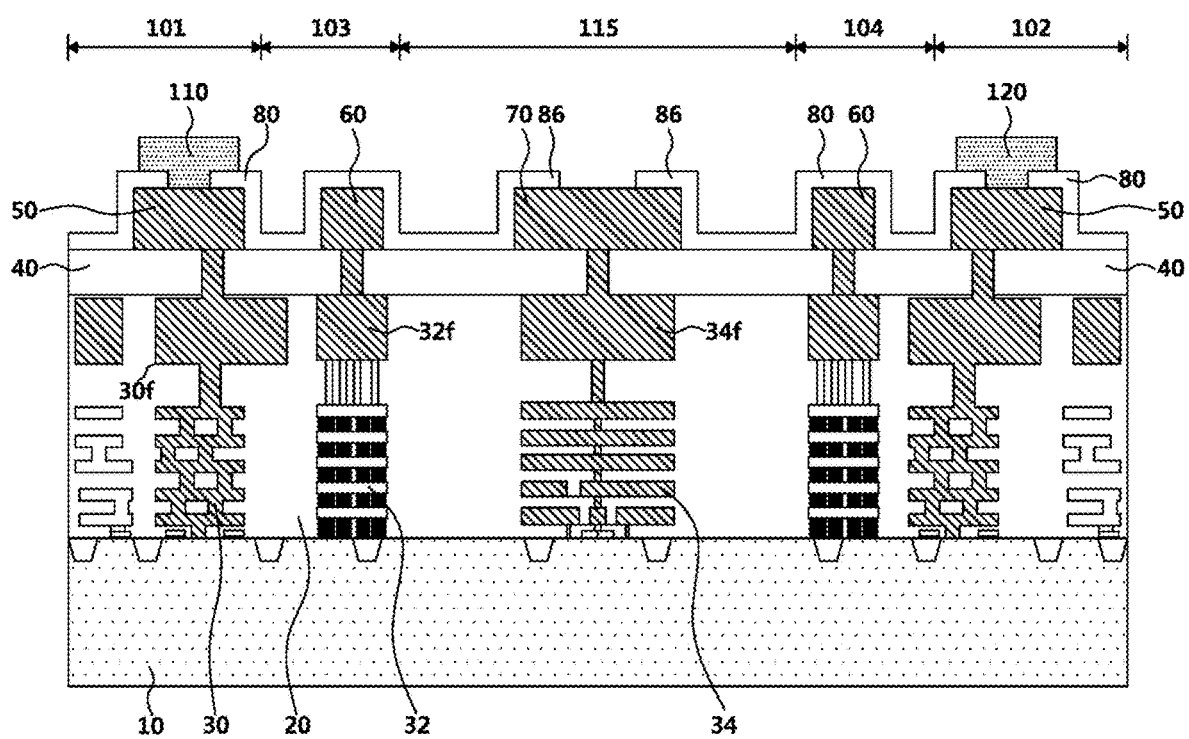
FIG. 3 is a cross-sectional view of an example of a semiconductor device.

FIG. 3 is a cross-sectional view of an example of a semiconductor device.

As illustrated in FIG. 3, the wafer 100 includes semiconductor device regions 101 and 102, a scribe line region 115, and seal-ring regions 103 and 104.

The first and second semiconductor device regions 101 and 102 are regions in which a semiconductor device for signal processing is formed. Here, the first and second semiconductor device regions 101 and 102 may also be referred to as semiconductor die regions.

As illustrated in FIG. 3, a gate dielectric layer (not illustrated), a gate electrode (not illustrated), and a contact plug and the like are formed in the first and second semiconductor device regions 101 and 102 for signal processing.

As illustrated in FIG. 3, the semiconductor device region is divided into a first device region and a second device region with respect to the scribe line region 115 for convenience. The first and second semiconductor device regions 101 and 102 both have the same structure formed. In the example of the present disclosure, the first and second semiconductor devices may be, for example, display driving devices, but not limited thereto, and may include other semiconductor devices such as LDMOS, EDMOS, CMOS, BCD, Bipolar, MOSFET, diode, Power discrete MOSFETs, super-junction MOSFETs, IGBTs or a high voltage device.

The scribe line region 115 may be a region in which a test pattern for testing the performance of a semiconductor device formed in a semiconductor device region is formed. Alternatively, after the etching process, a pattern capable of measuring a residual film thickness, measuring a pattern length or a pattern for a mask alignment may be formed in the region. The scribe line region may be later removed by a sawing process.

Seal-ring regions 103, 104 may be desired to prevent crack when performing sawing or dicing for isolating the semiconductor device region.

As illustrated in FIG. 3, the semiconductor device has a substrate 10, and a first interlayer dielectric layer 20 is formed on the substrate 10. The first interlayer dielectric layer 20 may be a low-k dielectric layer, and such a low-k dielectric layer may be desired for reducing RC delay. Then, a plurality of metal wires 30, 32, and 34 (multi-layer metal: MLM, 30) may be formed on the low-k dielectric layer 20. The metal wires 30, 32, and 34 may use copper (Cu) metal or aluminum (Al) metal. Copper metal is often used because it has a smaller resistivity than aluminum metal. The last metal wires 30f, 32f, and 34f of the metal wires are formed thicker than the thicknesses of the other metal wires 30, 32, and 34 to reduce resistance.

As illustrated in FIG. 3, a second interlayer dielectric layer 40 is formed on the last metal wires 30f, 32f, and 34f, and the first interlayer dielectric layer 20 in the semiconductor device. The low-k dielectric layer 20, which is the first interlayer dielectric layer, and the second interlayer dielectric layer 40 may be collectively referred to as an interlayer dielectric layer. In other words, the interlayer dielectric layer of the semiconductor device, according to the example of the present disclosure, includes first and second interlayer dielectric layers 20 and 40. The second interlayer dielectric layer 40 may be desired for preventing moisture, and for alleviating the impact when wire bonding the metal pads 50 and 60. It has a dielectric constant with a greater dielectric constant value than the first interlayer dielectric layer 20. Alternatively, the second interlayer dielectric layer 40 may use the same dielectric layer as the first interlayer dielectric layer 20 in order to reduce RC delay. The second interlayer dielectric layer 40 uses a thick silicon oxide film or a silicon nitride film, or a silicon oxynitride film.

As illustrated in FIG. 3, the first, second, and third metal pads 50, 60, and 70 are formed on the second interlayer dielectric layer 40. Here, the first metal pad 50 may be a metal pad formed in the first or second device region. The second metal pad 60 may be a metal pad formed in the first or second seal-ring regions 103 and 104, respectively. The third metal pad 70 may be a metal pad formed in the scribe line region 115. Here, the third metal pad 70 may be also referred to as a test pad 70 as it is used for a device performance test. In addition, copper metal (Cu) or aluminum (Al) metal may be used as the material of the metal pads 50, 60, and 70. Because aluminum (Al) metal is advantageous for the bonding pad, aluminum (Al) metal may be used as an example of the present disclosure.

As illustrated in FIG. 3, a plurality of passivation dielectric layer patterns 80 and 86 are formed on the low-k dielectric layer 20, the metal pads 50 and 60, and the test pad 70. The first passivation dielectric layer pattern 80 may be formed to surround the metal pads 50 and 60. On the other hand, the second passivation dielectric layer pattern 86 may be formed to surround the test pad 70.

As illustrated in FIG. 3, the first passivation dielectric layer pattern 80 of the semiconductor device regions 101 and 102 and the second passivation dielectric layer pattern 86 of the scribe region are connected to each other. It may be a structure that the passivation dielectric layer 80 remains on the second interlayer dielectric layer 40.

As illustrated in FIG. 3, the metal pads 50 and 60 and the test pad 70 are exposed by the passivation dielectric layer patterns 80 and 86. In the semiconductor device, according to the present disclosure, the upper portions of the metal pads 50 and 60 and the test pad 70 are exposed by the passivation dielectric layer patterns 80 and 86.

The first passivation dielectric layer pattern 80 and the second passivation dielectric layer pattern 86 are both formed under the same conditions in the same process. A plurality of passivation dielectric layer patterns 80 and 86 are desired for protecting the device from external moisture. The plurality of passivation dielectric layer patterns may be referred to as a kind of protective layer pattern. The passivation dielectric layer patterns 80 and 86 may be formed by successively depositing a silicon oxide film and a silicon nitride film. That is, the passivation dielectric layer pattern 80 may be a double film of a silicon oxide film and a silicon nitride film. Alternatively, a single film using a silicon nitride film alone may be used. The passivation dielectric layer patterns 80 and 86 are formed in direct contact with the second interlayer dielectric layer 40.

As illustrated in FIG. 3, the metal bumps 110 and 120 are formed on the metal pad 50 and the passivation dielectric layer pattern 80 of the first and second device regions, and the metal bumps 110 and 120 are directly connected to the metal pad 50. The metal bumps 110 and 120 will later be in one-to-one connection with Cu lead wires formed on the polyimide film of the display panel in the packaging process. Cu, Au, and Sn may be used as a material of the metal bumps 110 and 120. Instead of bumps, ball-shaped balls may be formed. Here, it may be referred to as a 'connection means' because it serves to connect the metal bump to the metal pad and the external terminal.

Figure 4:
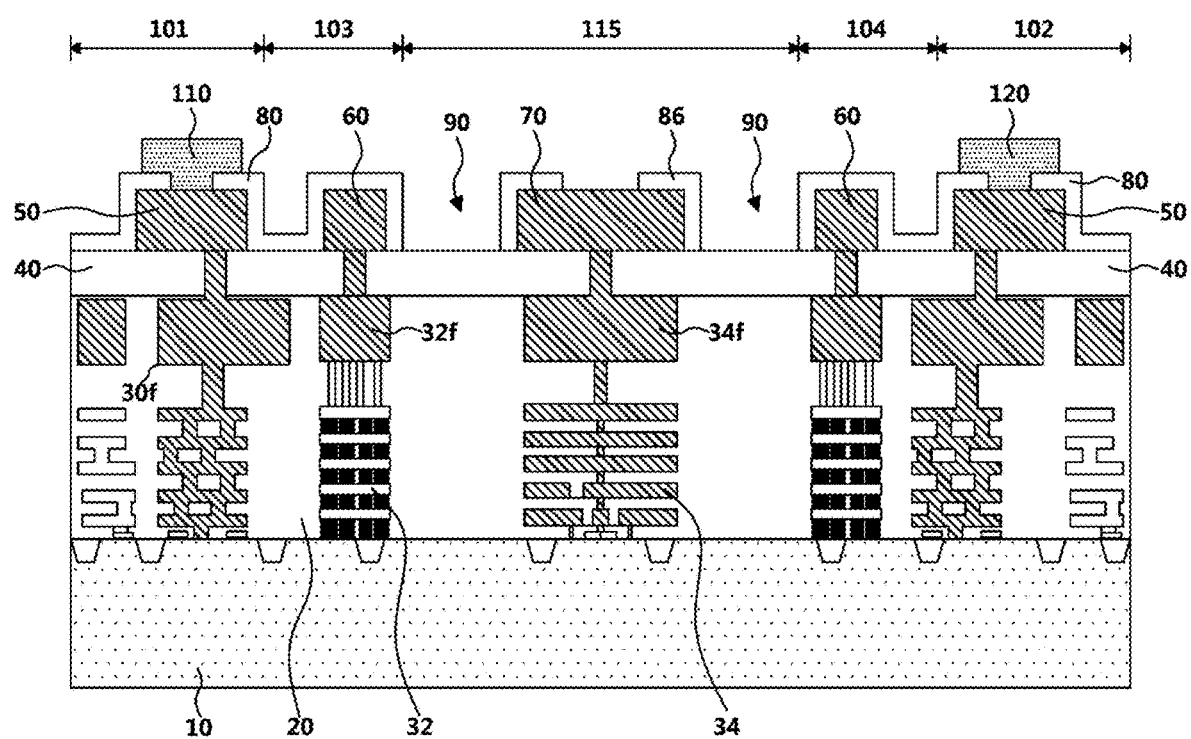
FIG. 4 is a cross-sectional view of another example of a semiconductor device.

FIG. 4 is a cross-sectional view of another example of a semiconductor device.

As illustrated in FIG. 4, a plurality of passivation dielectric layer patterns 80 and 86 are formed on the low-k dielectric layer 20, the metal pads 50 and 60, and the test pad 70. The passivation dielectric layer patterns 80 and 86 are divided into a first passivation dielectric layer pattern 80 and a second passivation dielectric layer pattern 86 according to the positions. The first passivation dielectric layer pattern 80 and the second passivation dielectric layer pattern 86 are formed spaced apart from each other.

The first passivation dielectric layer pattern 80 may be a dielectric layer pattern remaining on the metal pads 50 and 60 of the first or second semiconductor device regions 101 and 102 and the seal-ring regions 103 and 104. The second passivation dielectric layer pattern 86 may be a dielectric layer pattern remaining on the metal pad 70 of the scribe region 115. The first passivation dielectric layer pattern 80 and the second passivation dielectric layer pattern 86 are both formed under the same conditions in the same process.

As illustrated in FIG. 4, the passivation dielectric layer under reference number 90 is removed. Therefore, the first passivation dielectric layer pattern 80 of the semiconductor device regions 101 and 102 and the second passivation dielectric layer pattern 86 of the scribe region 115 are not connected. However, FIG. 3 illustrates that the first passivation dielectric layer pattern 80 of the semiconductor device regions 101 and 102 and the second passivation dielectric layer pattern 86 of the scribe region 115 are connected to each other.

In FIG. 4, the passivation dielectric layer in the region to be laser grooved may be referred to as a structure that is removed by dry etching. Such a structure may be advantageous for laser processing having an ultrashort pulse that may be later performed. This may be because depending on the laser light source, the passivation dielectric layer may be sometimes easily removed by laser processing and sometimes not. This is explained again in detail in the following paragraphs.

Thus, as illustrated in FIG. 4, the passivation dielectric layer existing between the semiconductor device regions 101 and 102 and the scribe line region 115 is removed. In order to remove the passivation dielectric layer in advance, the passivation dielectric layer may be entirely deposited on the semiconductor device structure, and a mask pattern may be formed on the passivation dielectric layer. The exposed passivation dielectric layer may be removed using the mask pattern. Therefore, the passivation dielectric layer existing between the semiconductor device regions 101, 102 and the scribe region 115 may be removed. However, the first passivation dielectric layer pattern 80 remains on the metal pad 50 of the first or second semiconductor device regions 101 and 102. In addition, the first passivation dielectric layer pattern 80 remains on the third metal pad 60 of the seal-ring regions 103 and 104.

Figure 5A:
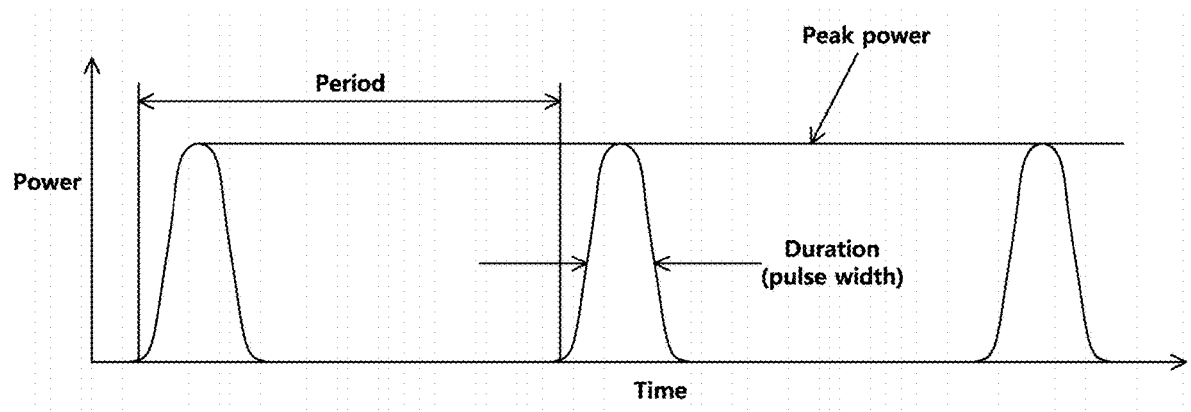
FIG. 5A is a diagram illustrating an example of a laser pulse.

FIG. 5A illustrates an example of a laser pulse.

In a micromachining method using UV or IR lasers, the laser pulse, pulse width, and the like are described as follows.

A pulse period is from the time the pulse is started until the next pulse is started. Therefore, it is referred to as a pulse width or a pulse duration in the present disclosure.

Peak power output from the laser refers to the maximum instantaneous light output of the laser peak. It means that the higher the peak power, the higher the laser output under the same laser conditions.

A pulse width generally refers to the time to reach the full width half maximum (FWHM), which means the full width of the half intensity of the maximum output pulse. FWHM refers to a pulse width at the point where the value of the peak power intensity of a specific laser peak becomes half. It means that the shorter the pulse width, the smaller the FWHM.

A pulse repetition rate is a frequency emitted by the laser, and the shorter the pulse period, the higher the pulse repetition rate value. Both laser pulse energy or laser pulse power and average laser power may vary depending on the pulse width. That is, the laser pulse energy and the average laser power value may be adjusted by increasing or decreasing the pulse width. As the pulse width increases, the laser pulse energy and the average laser power increase. In addition, in order to increase the average laser power, the pulse period may be reduced. Alternatively, in order to decrease the average laser power, the period may be increased. With respect to the same laser pulse energy, the shorter the pulse width (sec), the higher the peak power (W).

Therefore, the peak power (P peak) and the average laser power (P avg) may be described as the following equation.

Peak power (*P* peak)=pulse energy/pulse width.

Average laser power (*P* avg)=pulse energy*pulse repetition rate.

Table 1 shows the classification of laser processing according to pulse width.

TABLE 1

| Type of laser according to pulse width | unit | pulse width (sec) | Category |
|---|---|---|---|
| picoseconds laser processing | Picoseconds (1E−12 sec) | 1 to 999 ps | Ultrashort pulse |
| femtoseconds laser processing | Femtoseconds (1E−15 sec) | 1 to 999 fs | Ultrashort pulse |

As illustrated in Table 1, laser micromachining with a pulse width is divided into 1) picoseconds, 1 ps=1E-12 sec, and 2) femtoseconds, 1 fs=1E-15 sec laser processing.

Picoseconds or femtoseconds laser processing has a pulse width of 1 nanosecond or less. Therefore, in an example of the present disclosure, the picoseconds or femtoseconds laser processing is referred to as laser processing having an ultrashort pulse width USP. The pulse width of 1 nanosecond or less is defined as the ultrashort pulse width USP.

The ultrashort (USP) laser micromachining may be divided into picoseconds laser micromachining method having picoseconds pulse and femtoseconds laser micromachining method having femtoseconds. For example, the picoseconds laser has a pulse duration (tp) in the region of 1-999 ps. The femtoseconds laser has a pulse duration (tp) in the 1-999 fs range.

Figure 5B:
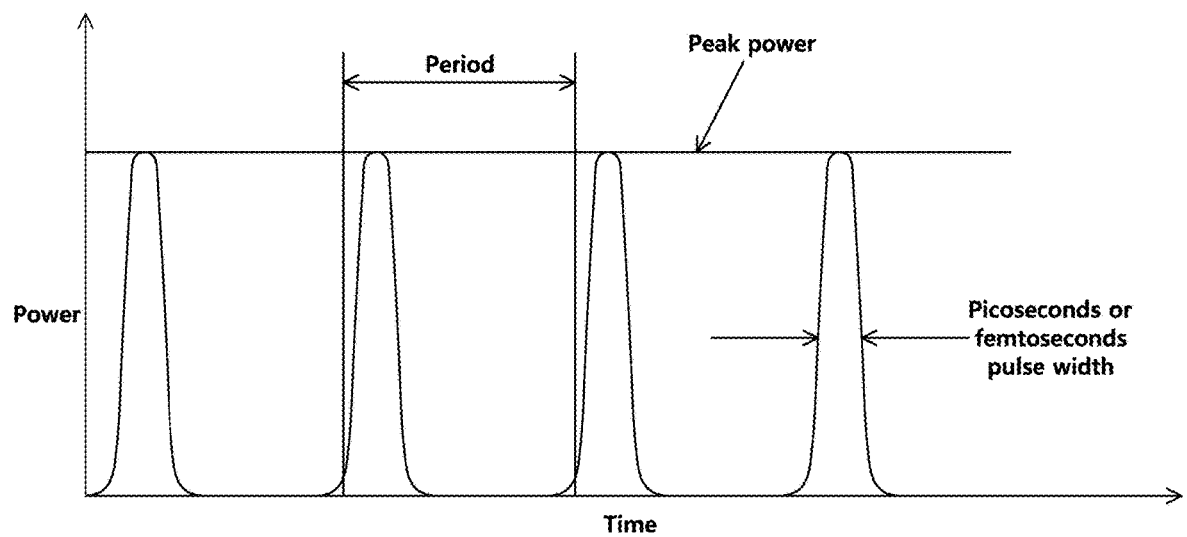
FIG. 5B is a diagram illustrating an example of an ultrashort laser pulse.

FIG. 5B is a view explaining an example of an ultrashort laser pulse.

FIG. 5B illustrates a laser pulse having picoseconds or femtoseconds pulse width. The pulse width is defined to be much smaller than in FIG. 5A. However, in order to increase the laser pulse energy or laser pulse power and the average energy (power), the peak power is greatly improved, as illustrated in FIG. 5B. Thus, a laser pulse using picoseconds or femtoseconds pulse widths may have a higher peak power than typical methods using laser pulses. However, it may be desired to set a proper value for the peak power in order to prevent the wafer from cracking during laser processing. If it is difficult to adjust the peak power, the laser pulse period may be set to be short. That is, a period of a laser pulse having picoseconds or femtoseconds pulse width used in the disclosed method may be shorter than a period of a laser pulse used in typical methods. This is because the interval between the pulses may be reduced as the pulse width becomes shorter. Therefore, a laser pulse having picoseconds or femtoseconds pulse width in the disclosed methods may have a higher peak power or a shorter pulse period than the laser pulse of typical methods.

Figure 7:
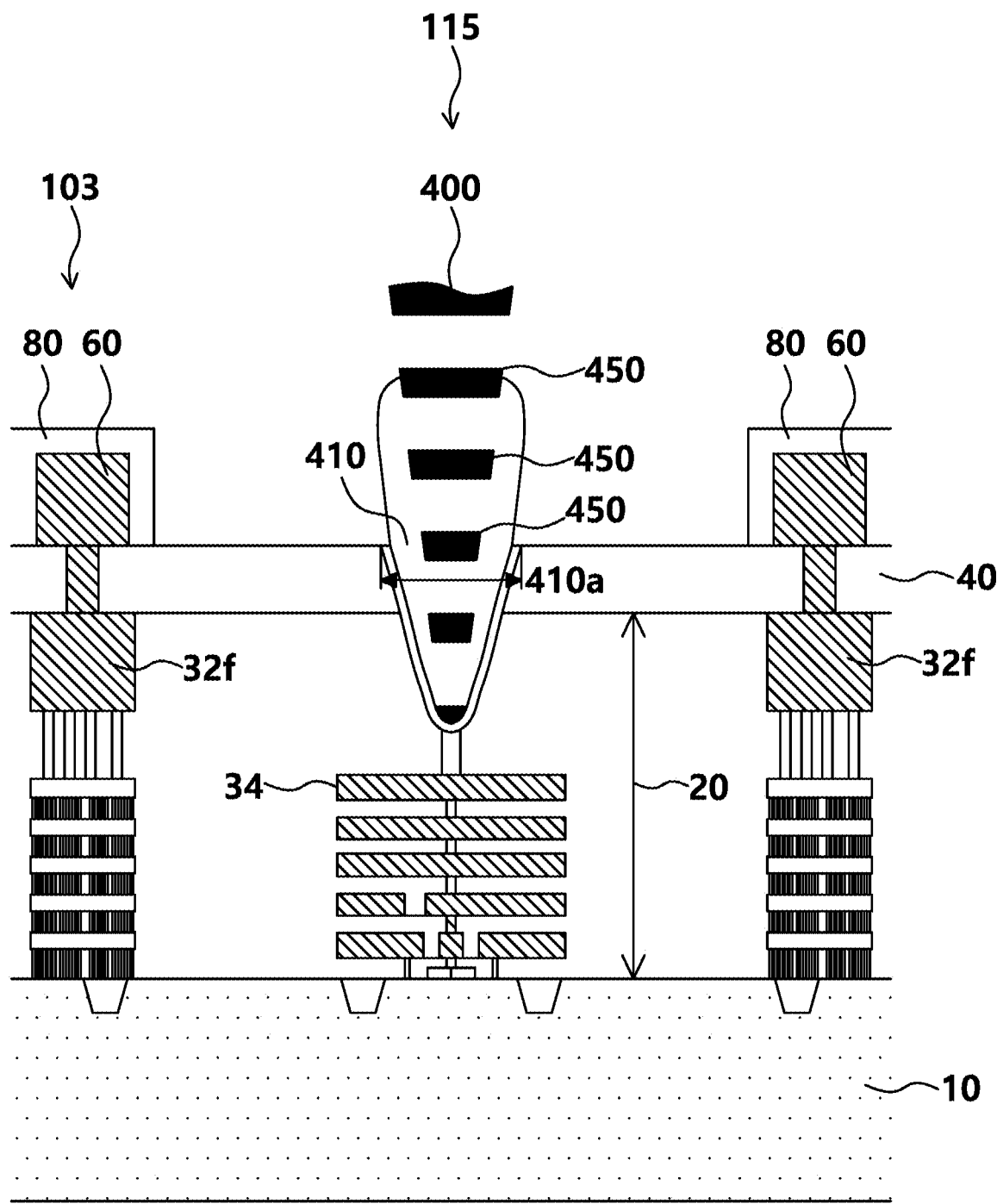
FIG. 7 illustrates an example of laser micromachining using an ultrashort pulse having picoseconds or femtoseconds pulse width.

FIG. 7 is a view explaining an example of an ultrashort pulse UV laser micromachining method having picoseconds pulse width or femtoseconds pulse width 450. It is possible to minimize cracks and conductive particles or laser residue caused by the cracks in the disclosed methods because the ultrashort pulse UV laser light source has a smaller pulse width than typical laser processing methods. Due to the width 410a of the region 410 receiving the laser light source being formed much smaller than FIG. 6, it hardly receives thermal damage, thereby preventing the decrease in the intensity of the wafer 100. In addition, conductive particle or laser residue is hardly generated on the surface of the passivation dielectric layer 80. As a light source having a laser power having an ultrashort pulse width is exposed for a short time, the frequency of crack generation in the interlayer dielectric layers 20 and 40 decreases, and the intensity of the wafer 100 itself is maintained.

In the present disclosure, laser micromachining may be performed using a laser light source. Alternatively, in order to prevent a heat-affected zone from being formed, the laser micromachining may be performed using a laser having a pulse width of approximately 8 to 12 ps.

An ultrafast laser micromachining, such as picoseconds or femtoseconds, is significantly different from conventional laser processing using continuous wave lasers or longer microsecond (1E-06 sec) pulse lasers. It will be apparent after an understanding of the disclosure of this application that the big difference comes from the basic principle or mechanism of the laser-induced material removal process.

It will be apparent after an understanding of the disclosure of this application that the use of an ultrafast pulse 450, such as picoseconds or femtoseconds, has a laser pulse duration much shorter than the energy transfer time between a free electron and a material grid. Therefore, it will be apparent after an understanding of the disclosure of this application that very high pressure and temperature may be obtained at a very small (μm) depth. However, it will be apparent after an understanding of the disclosure of this application that the absorbed energy heats the interlayer dielectric layers 20 and 40 very quickly due to high kinetic energy. It will be apparent after an understanding of the disclosure of this application that materials such as oxide films (SiO2), nitride films (SiN) or oxycarbide films (SiOC) constituting the interlayer dielectric layers 20 and 40 are easily removed by direct evaporation from the surface without the formation of a recast layer.

Therefore, when compared to micromachining using continuous wave and long pulse laser, the ultrafast pulse 450 laser is known to have advantages of forming a fine structure, generating a clean processing shape and a small thermal damage region 410 without causing additional damage to the surroundings, or no change in the properties of the interlayer dielectric layers 20 and 40.

Figure 8A:
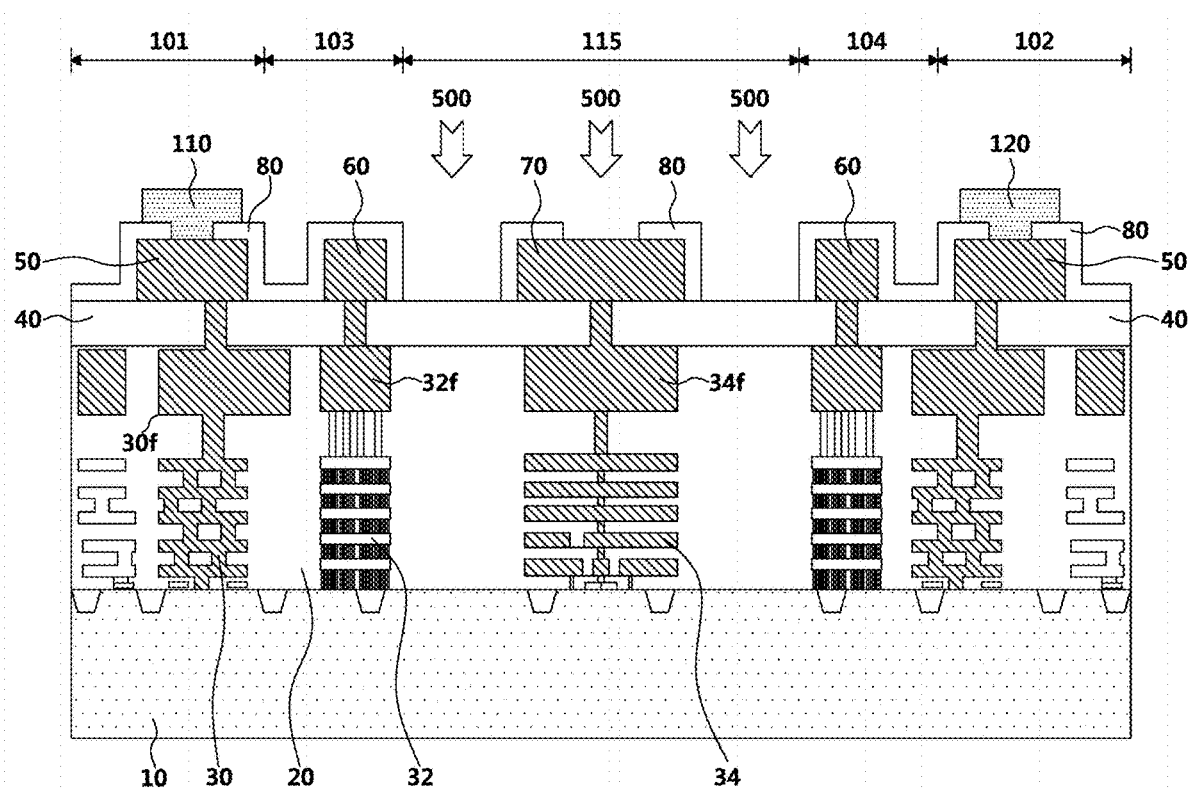

FIG. 8A is a diagram for an example of micromachining using an ultrashort pulse laser.

In the semiconductor device, laser micromachining may be performed by directly irradiating the region where the passivation dielectric layer 80 is removed from the scribe line region 115 with the ultrashort pulse laser light source 500 as illustrated in FIG. 5B. Because there is no passivation dielectric layer 80, the second interlayer dielectric layer 40 may be directly irradiated with the ultrashort pulse laser light source 500.

The laser micromachining method used for manufacturing the semiconductor die may be divided into laser micromachining of a UV or an IR method depending on the laser light source. The IR method has a longer wavelength than UV.

Infrared IR or visible light laser is known to melt or vaporize materials, hindering the formation of small and precise features and damaging the structural zero-defects of the wafer 100. In addition, IR lasers have additional limitations. It will be apparent after an understanding of the disclosure of this application that most materials used for manufacturing integrated circuits IC absorb energy more efficiently at shorter wavelengths than those produced by IR lasers. This means that much more power is desired to perform the same task compared to using a short wavelength laser. Such excessive energy often causes unnecessary damage to regions adjacent to the region of interest. Another disadvantage of IR lasers is that the cut size is limited to at least about 2 µm×2 µm due to the longer wavelength.

It will be apparent after an understanding of the disclosure of this application that heat is not generated around the beam spot because UV lasers process materials by directly cutting the atomic bonds of the substrate. It will be apparent after an understanding of the disclosure of this application that by reducing damage to the material, UV lasers may handle thinner and delicate materials much more effectively than visible and infrared IR lasers. It will be apparent after an understanding of the disclosure of this application that it is easy to create very precise cuts, holes, and other fine features because there is no heat damage around. Also, the laser beam spot size is directly proportional to the wavelength. Therefore, it will be apparent after an understanding of the disclosure of this application that UV lasers have higher spatial resolution than visible or infrared lasers and induce much more precise material processing.

The ultraviolet range of the UV lasers starts from just below the visible spectrum or less than 400 nm. Ultraviolet lasers are advantageous over IR lasers because most of the passivation dielectric layer 80 materials absorb more UV energy than IR energy. Therefore, much less UV energy is desired to directly remove the passivation dielectric layer. Because most passivation dielectric materials directly absorb UV energy, it will be apparent after an understanding of the disclosure of this application that UV lasers may directly remove passivation. Therefore, it will be apparent after an understanding of the disclosure of this application that UV laser processing may effectively remove the passivation region.

Most passivation materials are known to absorb less laser energy than metal lines absorb. Therefore, it will be apparent after an understanding of the disclosure of this application that effective removal of passivation requires higher energy than the energy desired for removing metal lines of the same size.

As described above, compared to the UV-type laser, the IR-type laser light source has the disadvantage that it cannot effectively remove the passivation dielectric layer 80. However, in the present disclosure, not only a UV laser light source but also an IR laser light source may be used because the passivation dielectric layer pattern 80 in the region receiving the laser light source may be removed in advance. However, because the passivation dielectric layer 80 remains on the test pad 60, it is more advantageous to use the UV laser light source than the IR laser light source.

FIG. 8B illustrates an example of micromachining using an ultrashort pulse laser.

As illustrated in FIG. 8B, the scribe line region, the dielectric layer region, and even a portion of the substrate may be removed by an ultrashort-pulse UV or IR laser micromachining. Therefore, the silicon substrate 10 is exposed to the inside due to the laser process.

In micromachining using an ultrashort pulse laser, a plurality of laser processes are performed by setting a constant laser power condition by designating an inverted trapezoid shape (U-shape zone) 210 in the scribe line 115 and the seal-ring region. In this example, by setting a low power, residues generated by laser grooving or debris may be prevented, and laser grooving may be performed stably. FIG. 8B illustrates the ultrashort pulse laser 215 irradiating while reciprocating one side and the other side of a U-shape zone 210 while maintaining a predetermined distance from the top to the bottom.

As such, the present disclosure relates to ultrashort pulse (USP) laser micromachining using an ultrashort pulse UV or IR laser light source. It will be apparent after an understanding of the disclosure of this application that ultrashort pulse IR laser processing consumes a lot of energy to remove the passivation dielectric layer 80. On the other hand, the passivation dielectric layer 80 is known to absorb UV wavelengths better than IR. Thus, the ultrashort pulse UV laser processing does not consume much energy for removing the passivation dielectric layer 80 even when the passivation dielectric layer 80 remains because it is sufficiently absorbed by the UV lasers. That is why ultrashort-pulse UV laser processing is more advantageous than IR laser processing.

In this example, the parameter conditions for the ultrashort pulse UV laser micromachining are shown in [Table 2].

TABLE 2

| Process parameter | Ultrashort pulse UV Laser grooving |
| --- | --- |
| Laser wavelength | 10-400 nm |
| pulse repetition rate | 20~800 kHZ |
| Average power | 0.2~30 W |
| Sample moving speed or scan speed | 10~7000 mm/sec |
| pulse duration (pulse width) | 1 fs to 999 ps |

Figure 8C:
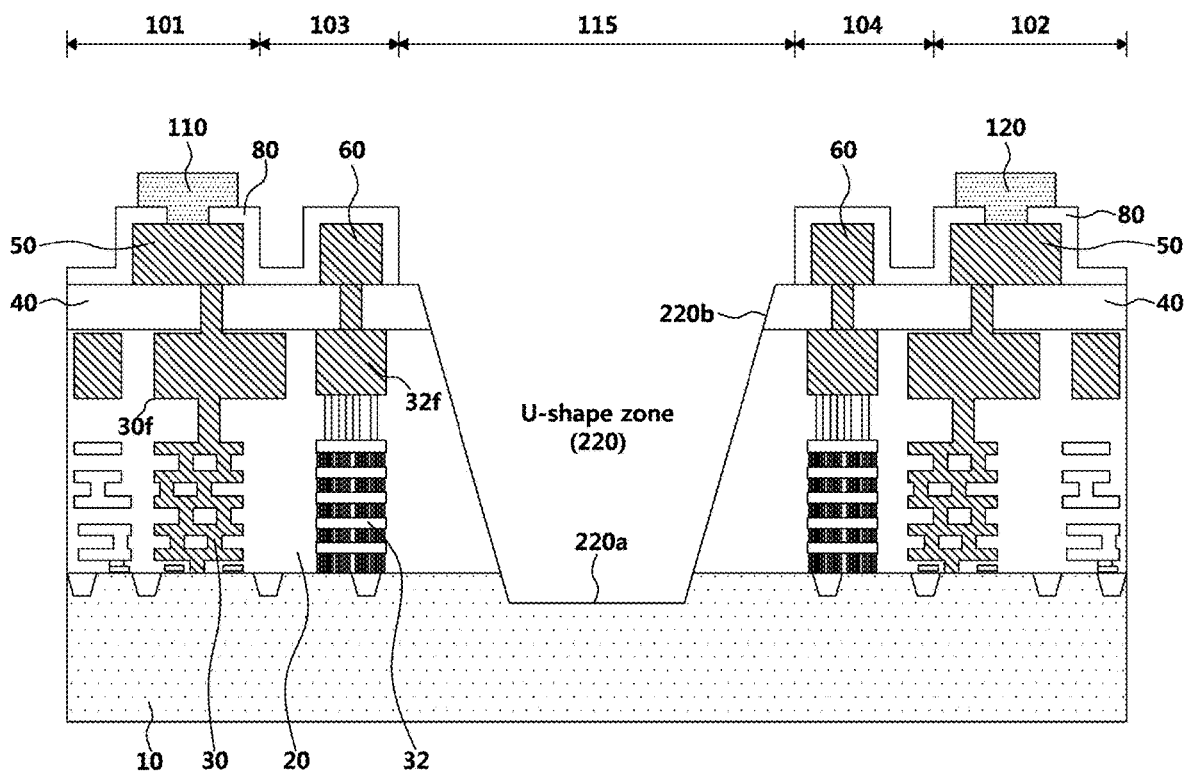

FIG. 8C illustrates an example of micromachining using an ultrashort pulse laser.

After the laser grooving process in FIG. 8C, an inverted trapezoidal U-shape zone 220 is formed. This may be referred to as a laser groove region. Due to the formation of the U-shape zone 220, the bottom surface 220a is flat so that residues or debris are not generated during the blade dicing process. If it is not flat or if there are irregularities on the substrate, the blade may wear out, and additional silicon debris may be generated. The side of the U-shape zone 220b is expressed smoothly in the drawing but may be formed in a shape of a step.

And the substrate 10 of the scribe line region 115 may be exposed by the micromachining using the ultrashort pulse laser.

Figure 8E:
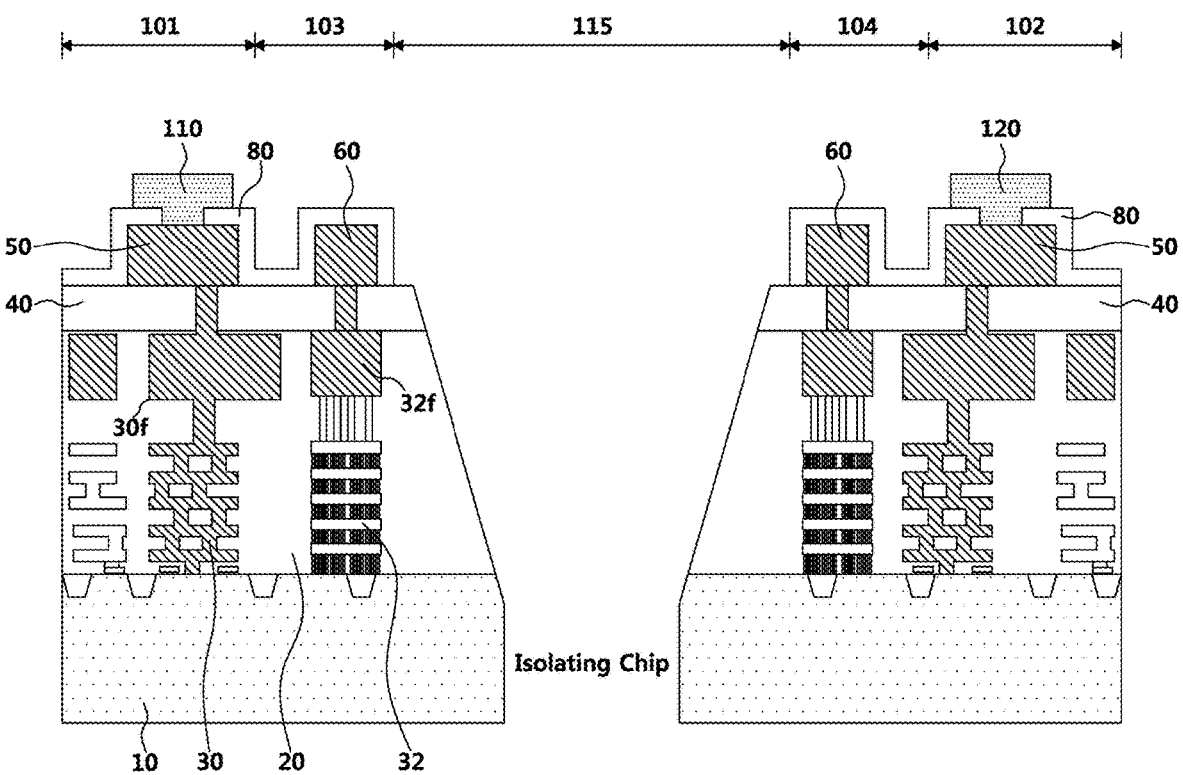

FIGS. 8D and 8E illustrate an example of a blade dicing process.

A blade dicing process is performed on the substrate 10. After the blade dicing process is performed, the substrate 10 of the scribe line region 115 is removed, and thus the die region 101 and the die region 102 are isolated to complete the blade dicing process. And a semiconductor chip packaging or semiconductor die packaging process may be performed.

FIGS. 9A to 9E illustrate another example of micromachining using an ultrashort pulse laser.

The similarities with the examples of FIGS. 8A to 8E are omitted.

Figure 9A:
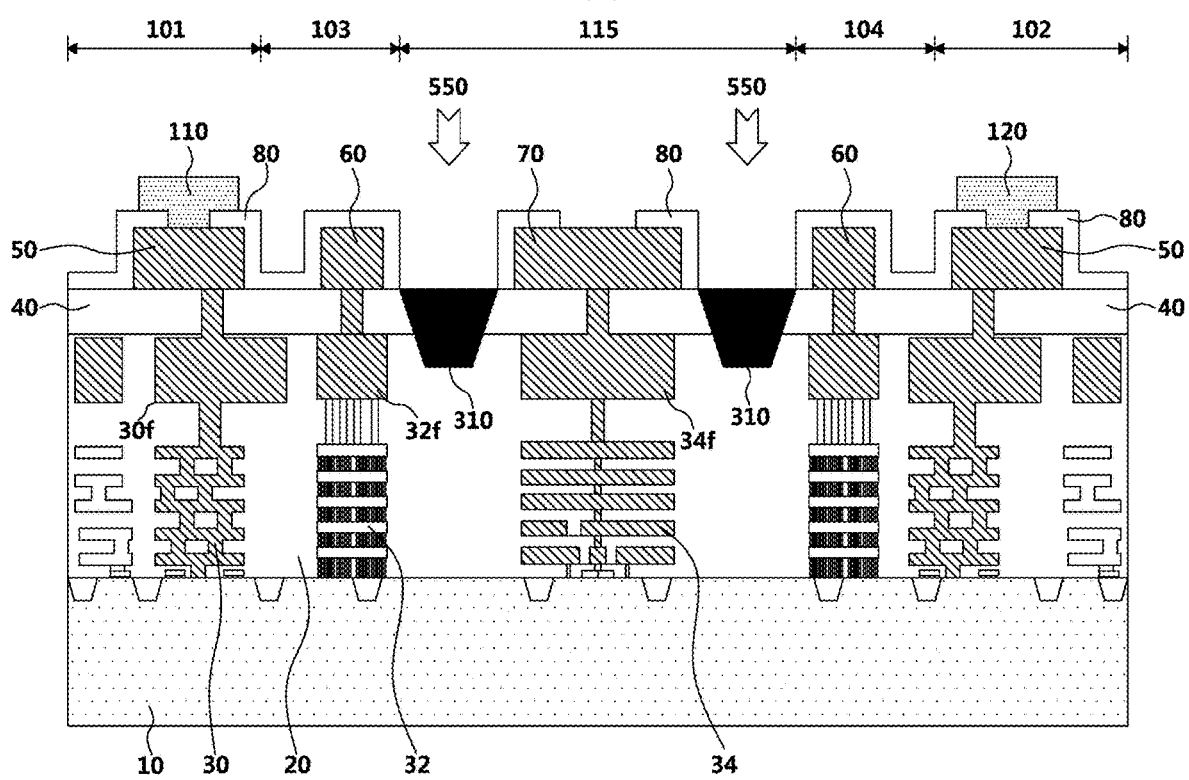

Referring to FIG. 9A, a laser grooving process is performed by directly irradiating the region 310 where the passivation dielectric layer 80 is removed with the ultrashort pulse laser light source 550. A first laser grooving process is performed on the interlayer dielectric layer region 40 between the scribe line 115 and the seal-ring region 104. Unlike FIG. 8B, it is not performed several times at constant power, but the laser grooving region is performed at one time. Because a metal or device region is not formed in the interlayer dielectric layer 40, residues or debris are not generated at the time of laser grooving so that the laser grooving process may be performed at one time.

Referring to FIG. 9B, a first low-power laser groove region 320 is formed on the edge of the scribe line 115. Residues or silicon debris generated during scribe line laser grooving may be prevented through the first low-power laser groove region 320. In addition, the laser grooving process may be performed only for the scribe line region, so that the laser grooving process may be performed on a smaller region than the example of FIG. 8.

Referring to FIG. 9C, a second low-power laser grooving is performed on the scribe line region. It is performed to partially overlap the first low-power laser groove region. As illustrated in FIG. 8B, the laser grooving is performed several times with constant power. When laser grooving, the laser groove becomes narrower toward the silicon substrate, and the laser grooving is performed in an inverted trapezoidal shape (U-shape zone) 330. Same as illustrated in 8B, a part of the substrate 10 is removed by laser grooving.

Referring to FIG. 9D, an inverted trapezoidal U-shape zone 340 is formed after scribe line laser grooving. The U-shape zone 340 is formed inside the scribe line 115. And the step-shaped laser groove region 350 formed by the first laser grooving process is formed together with the U-shape zone 340. Two side surfaces 340b and 350b are formed by the first and second laser grooving processes. Thus, laser groove regions 340 and 350 having two different slopes are formed.

Figure 9E:
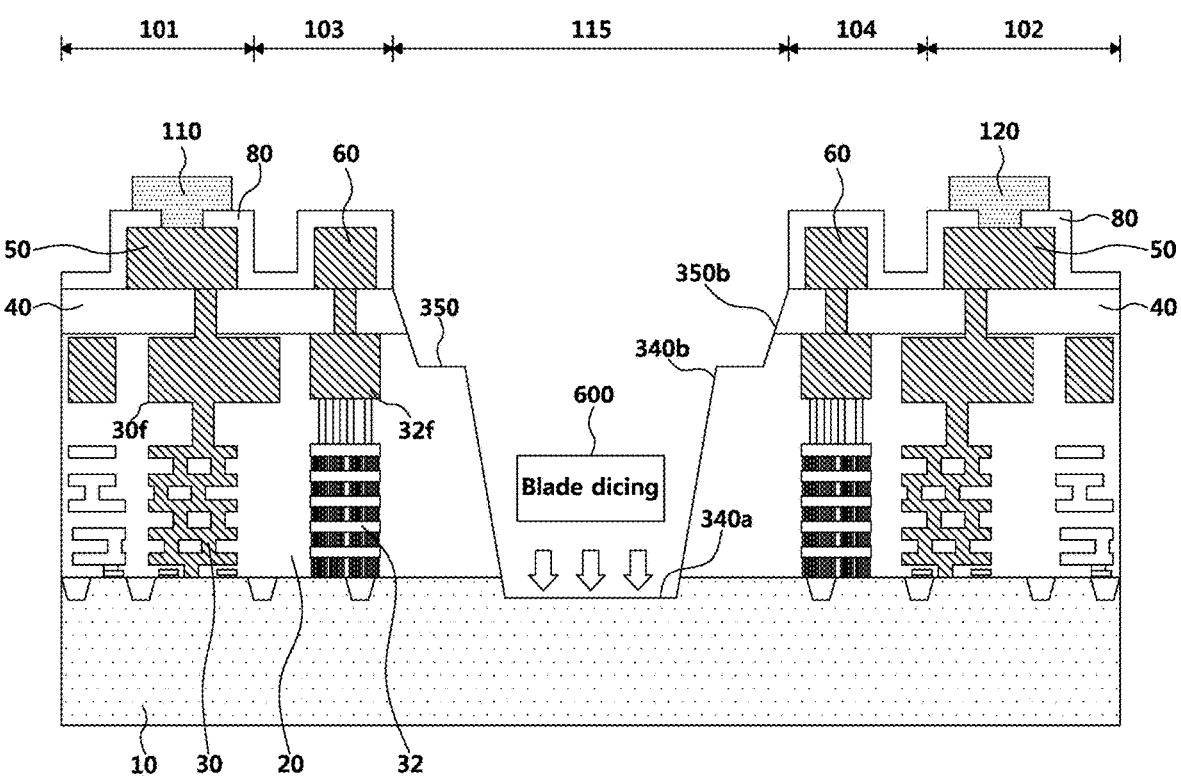

Referring to FIG. 9E, a blade dicing process 600 is performed on a U-shape zone.

Referring to FIG. 9F, after the blade dicing process, a die region 1 and a die region 2 are separated. In addition, a semiconductor chip packaging or semiconductor die packaging process may be performed.

The slope of the interlayer dielectric layer 340b, disposed on the first interlayer dielectric layer 20, is different from a slope of a side of the substrate. The first interlayer dielectric layer has an inverted trapezoidal U-shape zone, which is formed due to laser grooving, results in a slope 340b formed on the side surface of the first interlayer dielectric layer. The semiconductor substrate region may be sawed by the blade sawing at a right angle so that a slope 10b close to the right angle is formed on the side.

Figure 10:
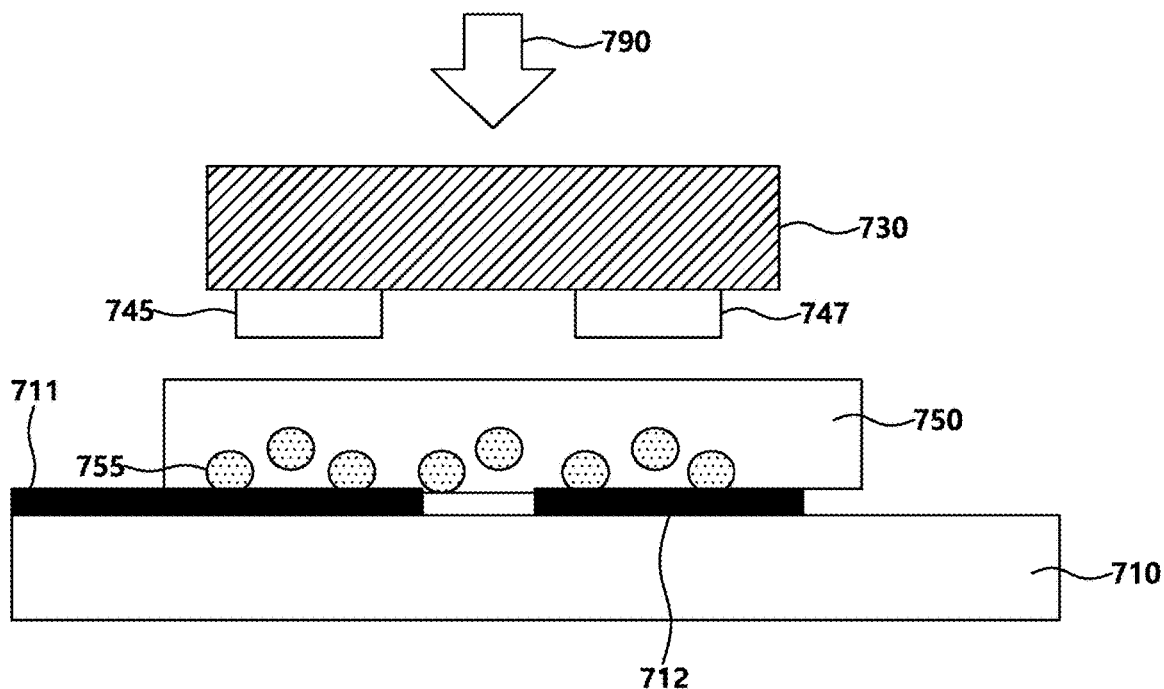
FIG. 10 illustrates an example of a processing state before attaching a semiconductor die to a flexible substrate of a display panel.

FIG. 10 illustrates an example of a processing state before attaching a semiconductor die to a flexible substrate of a display panel.

In the present disclosure, a display driver IC (DDI) and/or a display driver chip is exemplified as a semiconductor die. The pressing process 790 may be a process of physically connecting the display driving chip 730 cut by the sawing process to the bonding pads 711, 712 or leads 711, 712 of a flexible substrate 710. Anisotropic conductive film ACF 750 may be used in such a pressing process.

In order to perform the pressing process 790, a flexible substrate 710, including a plurality of bonding pads or leads 711 and 712, may be prepared. By using an anisotropic conductive film (ACF), including a conductive ball 755 having the first size, the connectors 745 and 747 formed on the individual semiconductor die 730 or the display driving chip 730 may be pressed to be one-to-one to the bonding pads or leads 711 and 712. The size of the conductive ball may be smaller than the original size 755 by the pressing process.

Bonding pad 711, 712 may be made of copper component, and the connector 745, 747 may be also composed of a plurality of bumps that may be connected one-to-one with the bonding pad 711, 712. The inside of the ACF conductive ball 755 may be nickel-plated particles, and the outside may be provided with an ACF conductive ball 755 in an insulating coated form. By the ACF conductive ball 755, the connectors 745 and 747 of the display driving chip 730 and the flexible substrate 710 are electrically connected.

Figure 11:
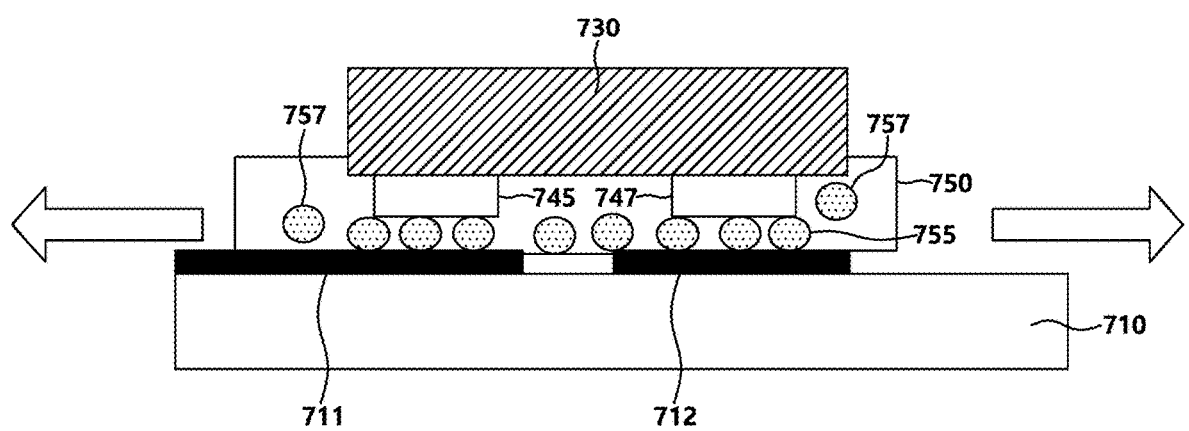
FIG. 11 illustrates an example of a processing state after attaching a semiconductor die to a flexible substrate of the display panel.

FIG. 11 illustrates an example of a processing state after attaching a semiconductor die to a flexible substrate of the display panel.

As illustrated in FIG. 11, the ACF conductive ball 755 may be present between the connector 745 and 747 and the bonding pad 711 and 712 of the flexible substrate 710 by the pressing process 790. Some ACF conductive balls 755 may move in both directions in the ACF film 750.

As described above, the Chip-on-Plastic or Chip-on-Panel (COP) packaging method of the present disclosure includes preparing a Chip-on-Plastic or Chip-on-Panel (COP) packaging method; preparing a display driving chip including a bump; preparing a flexible substrate including a bonding pad; attaching an anisotropic conductive film ACF including a conductive ball to the flexible substrate; attaching the bump of the driving chip and the bonding pad of the flexible substrate to each other using the anisotropic conductive film, and an organic light emission display panel OLED on the flexible substrate.

Figure 12:
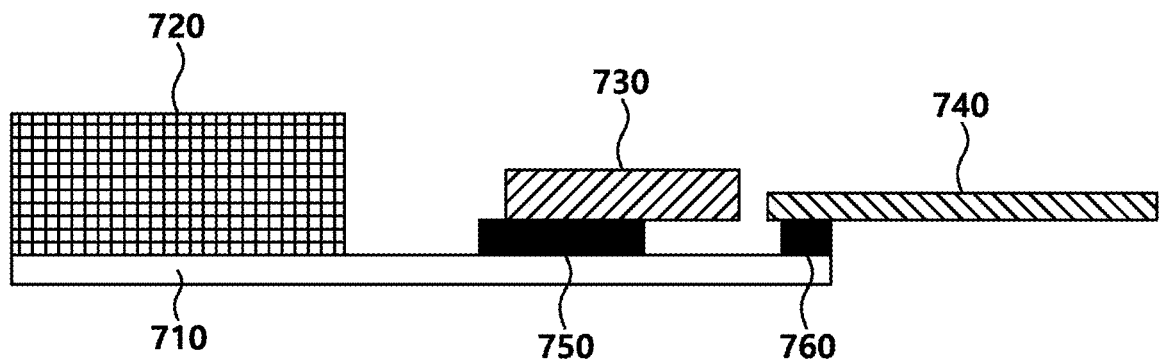
FIG. 12 is a cross-sectional view of an example of a chip-on-plastic package COP including a semiconductor die.
Figure 13:
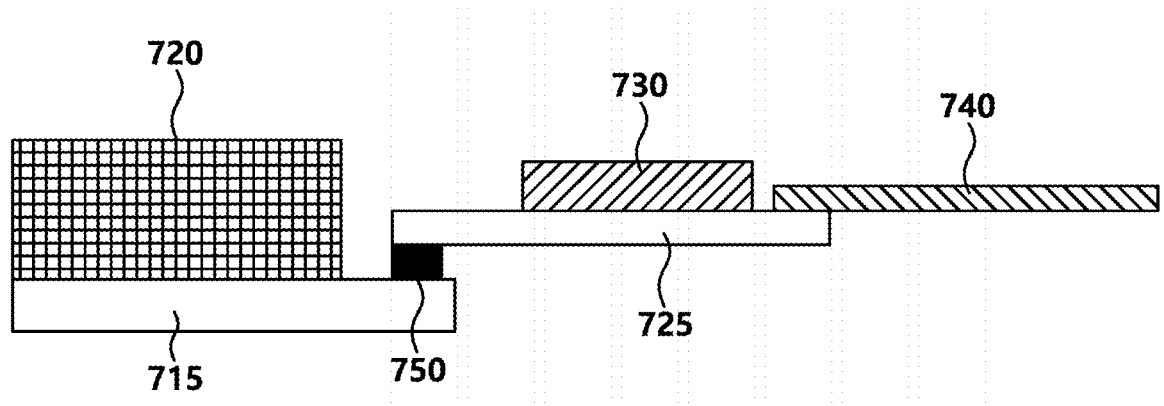
FIG. 13 is a cross-sectional view of an example of a chip-on-film package COF including a semiconductor die.

FIGS. 12 and 13 are cross-sectional views of an example of a chip-on-plastic package COP and a chip-on film package COF, including a semiconductor die.

In the present disclosure, a display driver IC (DDI) and/or a display driver chip is exemplified as a semiconductor die. As a semiconductor die, it is not limited to a display driver IC DDI, and other semiconductor devices may be exemplified.

Firstly, as illustrated in FIG. 12, in the chip-on-plastic package COP, a display panel 720, a display driving chip or an individual semiconductor die 730, and a flexible printed circuit board, FPCB 740 are formed on a flexible plastic semiconductor substrate 710.

The flexible plastic substrate or the flexible substrate 710 may be formed using a material such as polyimide (PI). A plurality of bonding pads 711 and 712 for receiving a signal to the display driving chip 730 may be formed on a flexible plastic substrate 710. The bonding pad of the flexible plastic substrate 710 may be electrically connected to the connector 755 of the display driving chip 730 through an anisotropic conductive film ACF 750. Here, the connector 745 refers to a metal connector composed of a bump or a ball. Likewise, the FPCB 740 may be connected to the bonding pad of the flexible plastic substrate 710 through the ACF 760. Hereinafter, the flexible plastic substrate 710 may be referred to as a flexible substrate 710. Here, the display panel 720 may be any one of a variety of display panels, including an LCD panel, an OLED panel, and the like. A touch sensor (not illustrated) or the like may be further disposed on the display panel 720. The FPCB 740 serves as an intermediate connector for transmitting a signal commanded by an application process (AP) of the display device to the display driving chip 730 in order to drive the display panel 720.

FIG. 13 is a cross-section of an example of a chip-on-film COF package. A display panel 720 may be formed on an upper surface of a rigid glass substrate 715. A display driving chip 730 may be formed on a flexible base film 725, and a PI base film may be connected to the rigid glass substrate 715 through the ACF 750. The FPCB 740 may be disposed being attached to the flexible base film 725. A plurality of input wiring patterns and a plurality of output wiring patterns exist on the flexible base film 725. The plurality of input wiring patterns may be electrically connected to the FPCB 740, and the plurality of output wiring patterns may be electrically connected to the display driving chip 730. The signal input from the FPCB 740 may be transmitted to the display driving chip 730, and the signal may be again transmitted to the thin film transistor TFT of the display panel 720.

According to the present disclosure as described above, a semiconductor die is formed by cutting the wafer using a USP UV laser processing method having an ultrashort pulse USP having picoseconds or femtoseconds pulse width.

By using an ultrashort pulse laser micromachining method having picoseconds or femtoseconds pulse width, damage to the wafer may be minimized, and conductive particle or laser residue may be minimized.

As described above, by providing a wafer in which a passivation dielectric layer is not formed on both sides of a test pad in a scribe line region, thereby performing micromachining using an ultrashort pulse IR laser light source in a semiconductor die forming process. Therefore, it is possible to improve the processing speed by performing the micromachining faster while suppressing the conductive particle or laser residue generated using the conventional UV-type laser light source.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A method for forming a semiconductor die, the method comprising:
   providing a substrate;
   forming a first interlayer dielectric layer on the substrate, the first interlayer dielectric layer being a low-k dielectric layer;
   forming a metal wire on the first interlayer dielectric layer;
   forming a second interlayer dielectric layer on the metal wire;
   forming a metal pad on the second interlayer dielectric layer;
   forming a passivation dielectric layer on the metal pad;
   patterning the passivation dielectric layer to expose the metal pad;
   forming a metal bump on the exposed metal pad;
   removing the patterned passivation dielectric layer adjacent to a scribe line region;
   laser grooving the second interlayer dielectric layer and the low-k dielectric layer exposed by removing the patterned passivation dielectric layer from the scribe line region using an ultrashort pulse laser; and
   cutting the substrate by mechanical sawing to form one or more semiconductor dies,
   wherein the second interlayer dielectric layer is exposed by removing the patterned passivation dielectric layer adjacent to the scribe line region, and
   wherein a light source of the ultrashort pulse laser directly irradiates the second interlayer dielectric layer to remove the second interlayer dielectric layer.

2. The method of claim 1, wherein a pulse width of the ultrashort pulse laser is in picoseconds or femtoseconds, and
   wherein the ultrashort pulse laser operates at ultraviolet or infrared wavelengths.

3. The method of claim 1, wherein the laser grooving of the second interlayer dielectric layer and the low-k dielectric layer includes;
   performing a first low-power laser grooving to form a first groove region on an edge of the scribe line region; and
   performing a second low-power laser grooving to form a second groove region on the scribe line region, and
   wherein a U-shape zone is formed by the laser grooving of the low-k dielectric layer.

4. The method of claim 3, wherein a slope of a side surface of the first groove region and a slope of a side surface of the second groove region are different from each other.

5. The method of claim 3, wherein a thickness of the second groove region is greater than a thickness of the first groove region.

6. The method of claim 1 further comprising:
   attaching the one or more semiconductor dies to a display flexible substrate using an anisotropic conductive film including a conductive ball.

7. The method of claim 1, wherein the laser grooving of the low-k dielectric layer is performed until the one or more semiconductor dies are exposed.

8. The method of claim 1, wherein the removing of the patterned passivation dielectric layer adjacent to the scribe line region is performed by a dry etching process.

9. A method for forming a semiconductor die, the method comprising:
   providing a substrate;
   forming a first interlayer dielectric layer on the substrate, the first interlayer dielectric layer being a low-k dielectric layer;
   forming a metal wire on the first interlayer dielectric layer;
   forming a second interlayer dielectric layer on the metal wire;
   forming a metal pad on the second interlayer dielectric layer;
   forming a passivation dielectric layer on the metal pad;
   patterning the passivation dielectric layer to expose the metal pad;
   removing the patterned passivation dielectric layer adjacent to a scribe line region;
   laser grooving the second interlayer dielectric layer and the low-k dielectric layer not covered by the patterned passivation dielectric layer using an ultrashort pulse laser; and
   cutting the substrate by mechanical sawing to form one or more semiconductor dies, wherein the laser grooving of the second interlayer dielectric layer and the first interlayer dielectric layer comprises:
performing a first low-power laser grooving to form a first groove region at an edge of the scribe line region, the first groove region being formed in the first and second interlayer dielectric layers; and
performing a second low-power laser grooving to form a second groove region on the scribe line region,
wherein a slope of a side surface of the low-k dielectric layer and a slope of a side surface of the semiconductor die are different from each other.

10. The method of claim 9, further comprising:
disposing one of the one or more semiconductor dies on a display flexible substrate.

11. The method of claim 10, wherein the disposing of one of the one or more semiconductor dies comprises:
attaching the one or more semiconductor dies to the display flexible substrate using an anisotropic conductive film (ACF) including conductive balls.

12. The method of claim 9, wherein a slope of a side surface of the low-k dielectric layer has two different slopes.

13. The method of claim 9, wherein a groove region having an inverted trapezoidal shape is formed by the laser grooving of the low-k dielectric layer.

14. The method of claim 9, wherein a chip packaging method is used to package a Chip-on-Plastic or Chip-on-Panel packaging.

15. The method of claim 9, further comprising:
forming a metal bump on the exposed metal pad,
wherein the second interlayer dielectric layer is exposed by removing the patterned passivation dielectric layer adjacent to the scribe line region, and
wherein the laser grooving of the second interlayer dielectric layer comprises directly irradiating the exposed second interlayer dielectric layer with a light source of the ultrashort pulse laser to remove the second interlayer dielectric layer.

16. The method of claim 9, wherein the passivation dielectric layer further comprises a silicon oxide film.

* * * * *